(12) United States Patent
Min

(10) Patent No.: US 8,508,124 B2
(45) Date of Patent: Aug. 13, 2013

(54) ORGANIC LIGHT-EMITTING DIODE DISPLAY

(75) Inventor: Kyoung-Wook Min, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/448,901

(22) Filed: Apr. 17, 2012

(65) Prior Publication Data

US 2013/0113368 A1 May 9, 2013

(30) Foreign Application Priority Data

Nov. 9, 2011 (KR) .................... 10-2011-0116475

(51) Int. Cl.
*H01L 51/50* (2006.01)
*H01L 51/52* (2006.01)

(52) U.S. Cl.
USPC ........... 313/505; 313/504; 313/512; 313/506; 257/59; 257/72; 257/E51.022

(58) Field of Classification Search
USPC .............. 313/500–512; 257/59, 72, E51.022
See application file for complete search history.

(56) References Cited

U.S. PATENT DOCUMENTS

| | | | |
|---|---|---|---|
| 7,279,708 B2 * | 10/2007 | Kwak et al. ...................... | 257/59 |
| 2004/0119066 A1 | 6/2004 | Han et al. | |
| 2005/0140290 A1 * | 6/2005 | Park et al. ...................... | 313/512 |
| 2005/0179377 A1 * | 8/2005 | Shitagami et al. ............ | 313/512 |
| 2005/0242719 A1 * | 11/2005 | Park .............................. | 313/504 |
| 2006/0055317 A1 * | 3/2006 | Baik et al. ..................... | 313/504 |
| 2006/0055318 A1 * | 3/2006 | Baik et al. ..................... | 313/504 |
| 2006/0113900 A1 * | 6/2006 | Oh ................................. | 313/504 |
| 2006/0125390 A1 | 6/2006 | Oh | |
| 2006/0202619 A1 | 9/2006 | Kim | |
| 2007/0052119 A1 | 3/2007 | Sakai et al. | |
| 2012/0268002 A1 * | 10/2012 | Osako et al. .................. | 313/504 |

FOREIGN PATENT DOCUMENTS

| | | |
|---|---|---|
| JP | 2007-80602 | 3/2007 |
| KR | 10-2004-0020783 | 3/2004 |
| KR | 10-2006-0067049 | 6/2006 |
| KR | 10-2006-0099241 | 9/2006 |
| KR | 10-2007-0029066 | 3/2007 |
| KR | 10-2008-0016129 | 2/2008 |
| WO | 2010/076396 | 7/2010 |

* cited by examiner

*Primary Examiner* — Mariceli Santiago

(74) *Attorney, Agent, or Firm* — Robert E. Bushnell, Esq.

(57) ABSTRACT

An organic light-emitting diode (OLED) display includes a substrate and a plurality of sub-pixels formed on the substrate, wherein the substrate includes a display region having formed therein sub-pixels to which colored organic materials are applied, and a non-display region formed at edges of the display region. The non-display region includes an outgassing portion and a cathode contacting portion, and protrusions and recessions having different numbers and unit opening areas are formed in at least one of the outgassing portion and the cathode contacting region. Thus, organic raw materials applied during manufacturing process may be prevented from remaining. Therefore, an increase in contact resistance due to organic raw materials remaining in a cathode contact region may be reduced.

20 Claims, 9 Drawing Sheets

ORGANIC LIGHT-EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 9 Nov. 2011 and there duly assigned Ser. No. 10-2011-0116475.

BACKGROUND OF THE INVENTION

1. Field of the Invention

The present invention relates to an organic light-emitting diode (OLED) display, and more particularly, to an OLED display for removing organic materials remaining in a non-display region.

2. Description of the Related Art

Generally, an organic light-emitting diode (OLED) display is a self-luminescent display featuring wide viewing angles, excellent contrast, and fast response.

Therefore, the OLED display is widely applied to mobile devices, such as digital cameras, video cameras, camcorders, mobile data terminals, smart phones, super-slim laptops, tablets, flexible display devices, etc. or to electric/electronic devices, such as super-slim TVs, etc.

The OLED display may embody colors as holes and electrons are respectively injected by anodes and cathodes, are recombined with each other, and emit light. In this regard, light is emitted when excitons, which are combinations of injected holes and electrons, transit from an excited state to a ground state.

OLED displays may be categorized according to driving mechanisms as follows: passive matrix (PM) type and active matrix (AM) type.

In a PMOLED display, anodes and cathodes are arranged in columns and rows, and scanning signals are supplied to the cathodes from a row driving circuit. In this regard, only one of the rows is selected. Furthermore, a data signal is inputted to each of the pixels by a column driving circuit.

An AMOLED display controls signals inputted to each of the pixels by using thin-film transistors (TFTs). Therefore, an AMOLED display is suitable for processing a large amount of signals, and thus the AMOLED display is popular as a display device for reproducing moving pictures.

Generally, in the case of forming an emissive layer via a nozzle printing method, a continuous ejection operation is performed to uniformly apply an organic raw material onto a display region of a substrate, reducing tact time, and reducing manufacturing cost.

As a result, an organic material is ejected not only onto a display region of a substrate, but also onto a non-display region of the substrate, such as a cathode contact region, in which it is not necessary to apply the organic material. Therefore, it is necessary to perform an additional processing operation, such as an organic material removal operation using oxygen plasma. Furthermore, if an organic material exists in a cathode contact region, cathode resistance increases.

SUMMARY OF THE INVENTION

The present invention provides an organic light-emitting diode (OLED) display having relatively less increase in contact resistance due to an organic material remaining in a non-display region during the formation of an emissive layer via a nozzle printing method.

According to an aspect of the present invention, there is provided an OLED display including a substrate and a plurality of sub-pixels formed on the substrate. The substrate includes a display region having formed therein sub-pixels to which colored organic materials are applied, and a non-display region formed at edges of the display region. The non-display region includes an outgassing portion and a cathode contacting portion, and protrusions and recessions having difference numbers, and unit opening areas are formed in at least one of the outgassing portion and the cathode contacting region.

The protrusions and recessions may include a plurality of first protrusions and recessions having a first unit opening area, and a plurality of second protrusions and recessions having a second unit opening area which is larger than the first unit opening area.

The number of second protrusions and recessions may be less than that of the first protrusions and recessions.

The size of each opening formed as the second protrusions and recessions may be larger than the size of each opening formed as the first protrusions and recessions.

The outgassing portion or the cathode contacting region may be continuously defined from an edge of the display region to the opposite edge of the display region in a direction in which nozzle units depositing organic raw materials move. The first protrusions and recessions may be formed in portions of the non-display region corresponding to the sub-pixels, and the second protrusions and recessions may be formed in portions of the non-display region corresponding to spaces between the sub-pixels.

A pitch between a pair of sub-pixels adjacent to each other may be identical to a pitch between a pair of the second protrusions and recessions formed in a portion of the non-display region corresponding to the space between the sub-pixels.

The protrusions and recessions may have a polygonal or circular opening pattern.

The outgassing portion or the cathode contacting region may be continuously defined outside the display region from an edge of the display region to the opposite edge of the display region in a direction in which a nozzle unit depositing organic raw materials moves. The protrusions and recessions may be formed so as to have different unit opening areas in adjacent regions formed in the direction in which the nozzle units move.

A pitch between a pair of sub-pixels adjacent to each other in the direction in which the nozzle units move may be identical to a pitch between a pair of protrusions and recessions formed adjacent to each other in a portion of the non-display region corresponding to the space between the sub-pixels.

The protrusions and recessions may include the first protrusions and recessions formed in portions of the non-display region corresponding to the sub-pixels adjacent to each other in the direction in which the nozzle units move, and the second protrusions and recessions formed in portions of the non-display region corresponding to spaces between the sub-pixels and having a unit opening area different from that of the first protrusions and recessions.

As a unit opening area of the first protrusions and recessions is smaller than that of the second protrusions and recessions, the number of first protrusions and recessions may be greater than that of second protrusions and recessions.

As a unit opening area of the first protrusions and recessions is larger than that of the second protrusions and recessions, the number of first protrusions and recessions may be less than that of second protrusions and recessions.

The cathode contacting region may be a region in which one of the electrodes of the display region and a power wire are electrically connected to each other.

A non-cathode contacting region, in which no conductive pattern is formed, may be further defined in a region adjacent to the cathode contacting region, and protrusions and recessions having different unit opening areas may be formed in the non-cathode contacting region.

The display region may include a thin-film transistor (TFT) comprising: a semiconductor active layer, a gate electrode, and source and drain electrodes; an insulation layer that is formed to cover the source and drain electrodes; and an organic emissive device that is formed on the insulation layer and which includes a first electrode connected to any one of the source and drain electrodes, an emissive layer, and a second electrode.

A plurality of protrusions and recessions may be formed in portions of the non-display region adjacent to the display region, a first conductive pattern corresponding to a power wire arranged on the substrate may be formed on the protrusions and recessions, and a second conductive pattern corresponding to the first electrode or the second electrode may be formed on the first conductive pattern.

The protrusions and recessions may include a plurality of first protrusions and recessions having a first unit opening area, and at least one second protrusion and recessions having a second unit opening area, which is larger than the first unit opening area.

The first protrusions and recessions and the second protrusions and recessions may be formed from an edge of the display region to the opposite edge of the display region in a direction in which a nozzle unit depositing organic raw materials moves. The first protrusions and recessions may be formed in portions of the non-display region respectively corresponding to sub-pixels, and the second protrusions and recessions are formed in portions of the non-display region respectively corresponding to spaces between the sub-pixels.

A pitch between a pair of sub-pixels adjacent to each other may be identical to a pitch between a pair of second protrusions and recessions formed in the portions of the non-display region respectively corresponding to spaces between the sub-pixels.

The protrusions and recessions may include at least one first protrusion and recessions having a first unit opening area, and a plurality of second protrusions and recessions having a second unit opening area, which is smaller than the first unit opening area.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
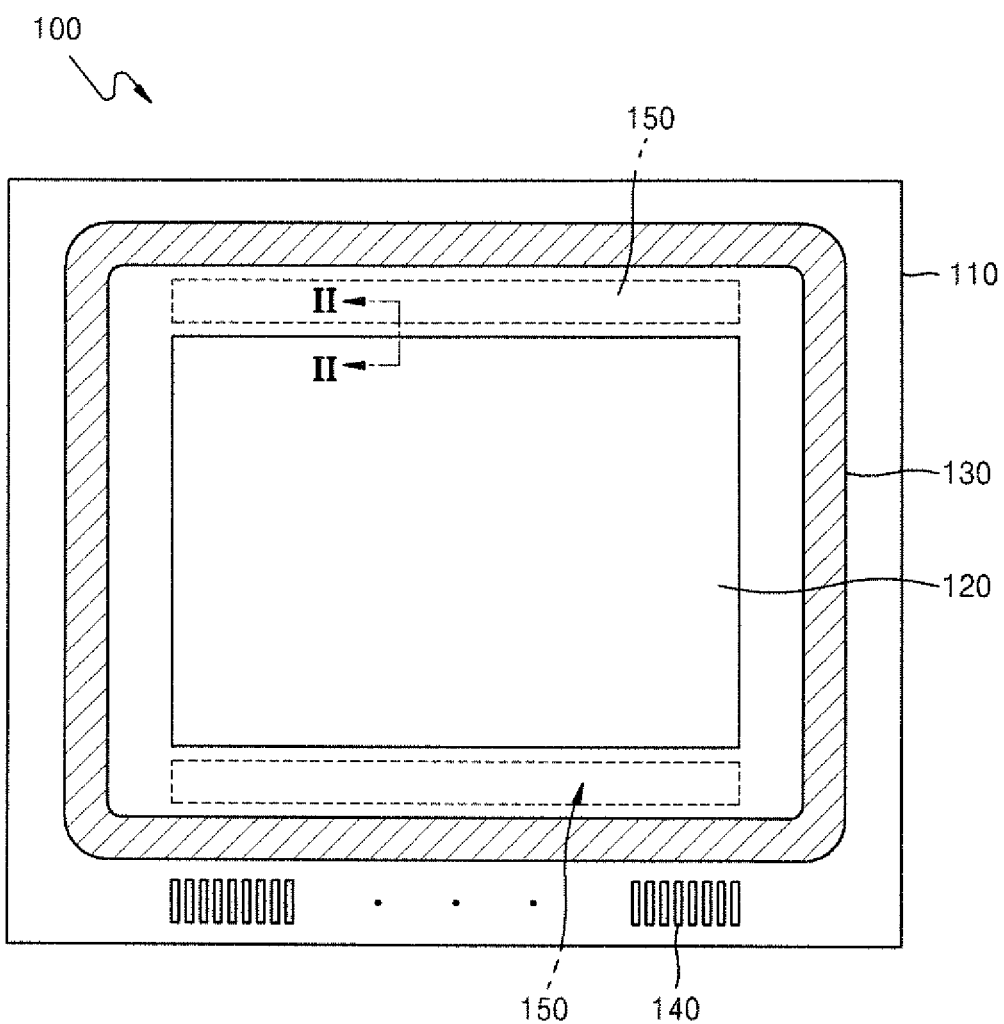
FIG. 1 is a block diagram of an organic light-emitting diode (OLED) display according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Organic light-emitting diode (OLED) display according to certain embodiments of the invention will be described below in more detail with reference to the accompanying drawings. Those components that are the same or are in correspondence are rendered the same reference numeral regardless of the figure number, and redundant explanations are omitted.

FIG. 1 is a block diagram of an organic light-emitting diode (OLED) display according to an embodiment of the present invention.

Referring to FIG. 1, the OLED display 100 includes a display region 120 which is formed on a substrate 110 and embodies images. A plurality of pixel regions are formed in the display region 120 and emit light as predetermined power is supplied thereto. A sealant 130 is formed around the display region 120. A plurality of terminals 140 are formed outside the sealant 130.

Although not shown, a plurality of wire lines, e.g., a driving power supply line for supplying driving power to a driving line (Vdd line) of a pixel region, a power supply line for supplying power to an electrode of an organic emissive device of the pixel region, a vertical driving circuit unit or a horizontal driving circuit unit for controlling signals applied to the pixel region, etc. are formed outside the display region 120.

In this regard, a non-display region 150 including a cathode contacting region is formed around the display region 120.

Figure 2:
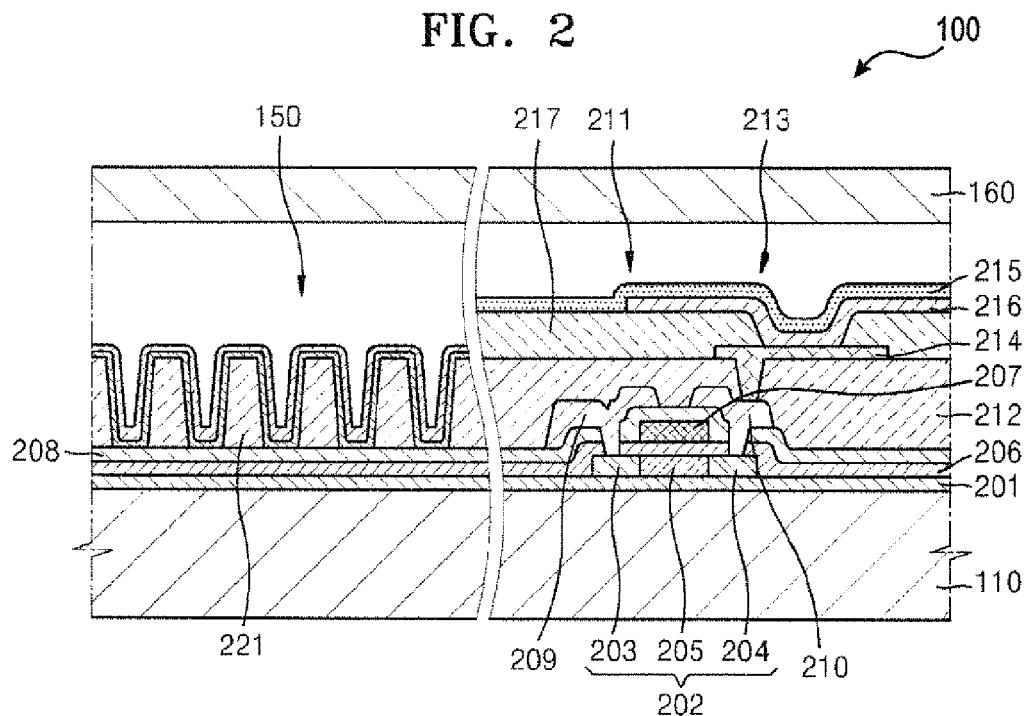
FIG. 2 is a sectional view of the OLED display of FIG. 1 taken along a line II-II of FIG. 1.
Figure 3:
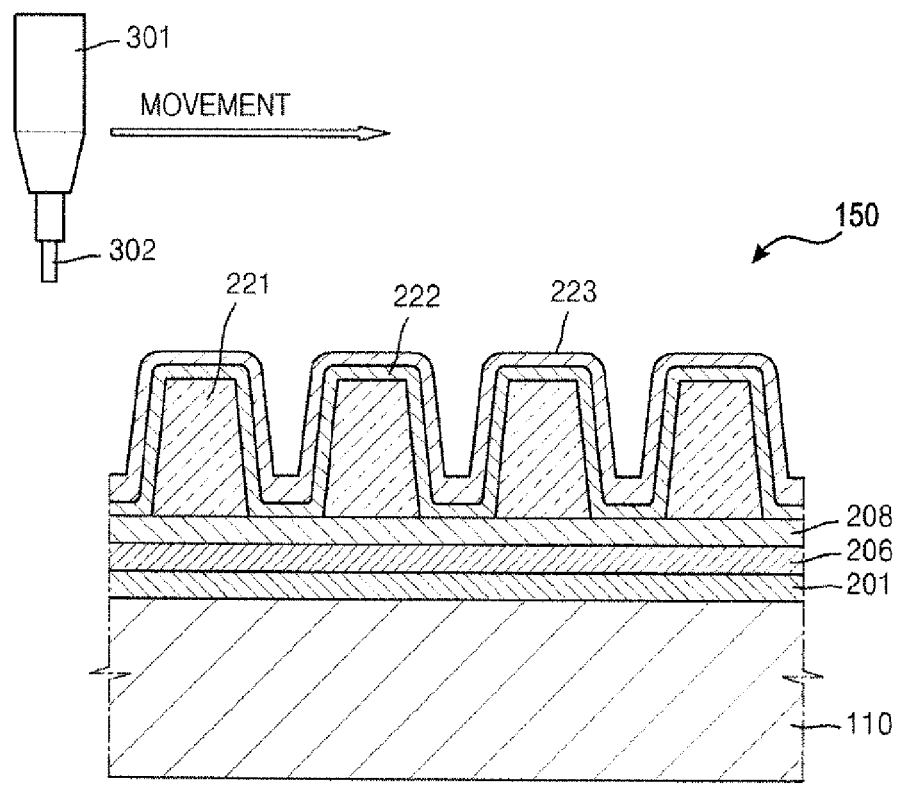
FIG. 3 shows a non-display region of FIG. 2 in more detail.

FIG. 2 is a sectional view of the OLED display of FIG. 1 taken along a line II-II of FIG. 1, and FIG. 3 shows the non-display region of FIG. 2 in more detail.

Referring to FIG. 2, the OLED display 100 includes the substrate 110 and an encapsulating substrate 160 which faces the substrate 110. The encapsulating substrate 160 is a substrate for encapsulating the substrate 110. Alternatively, an encapsulating layer may be formed on the substrate 110 instead of the encapsulating substrate 160.

The substrate 110 may be an insulation substrate formed of polymer, such as acryl, polyimide, polycarbonate, polyester, etc., or glass.

A buffer layer 201 may be formed on the top surface of the substrate 110. The buffer layer 201 includes an organic material, an inorganic material, or a stacked structure in which an organic material and an inorganic material are alternately stacked. The buffer ii layer 201 blocks oxygen and moisture, prevents moisture or impurity formed at the substrate 110 from being diffused, and helps crystallization of a semiconductor active layer by controlling a heat transmission rate during crystallization of the semiconductor active layer.

A semiconductor active layer 202 is formed on the top surface of the buffer layer 201. If the semiconductor active layer 202 is formed of polysilicon, the semiconductor active layer 202 is formed by forming amorphous silicon, crystallizing the amorphous silicon into polysilicon, and patterning the polysilicon.

The amorphous silicon may be crystallized via any of various methods including Rapid Thermal Annealing (RTA), Solid Phase Crystallization (SPC), Excimer Laser Annealing (ELA), Metal-Induced Crystallization (MIC), Metal-Induced Lateral Crystallization (MILC), Super Grain Silicon (SGS), Sequential Lateral Solidification (SLS), etc.

The semiconductor active layer 202 includes a source region 203 and a drain region 204 that are formed via implantation of n-type or p-type impurity ions. A region between the source region 203 and the drain region 204 is a channel region 205 that is not doped with an impurity.

A gate insulation layer 206 is deposited on the semiconductor active layer 202. The gate insulation layer 206 may be a single layer formed of $SiO_2$ or a double layer including a $SiO_2$ layer and a $SiN_X$ layer.

A gate electrode 207 is formed on the gate insulation layer 206. The gate electrode 207 may be formed of a single metal or metals, and may be formed of a single layer containing Mo, MoW, Cr, Al, an Al alloy, Mg, Cu, Ti, Ag, Al, Ni, W, or Au or layers formed of combinations thereof.

An interlayer insulation layer 208 is formed on the gate electrode 207. The interlayer insulation layer 208 may be a single layer formed of $SiO_2$ or a double layer including a $SiO_2$ layer and a $SiN_X$ layer. The gate insulation layer 206 and the interlayer insulation layer 208 are formed to expose portions of the source region 203 and the drain region 204, respectively, of the semiconductor active layer 202. A source electrode 209 is electrically connected to the exposed portion of source region 203 of the semiconductor active layer 202, and a drain electrode 210 is electrically connected to the exposed portion of the drain electrode 210 of the semiconductor active layer 202.

The source electrode 209 and the drain electrode 210 may be formed of Au, Pd, Pt, Ni, Rh, Ru, Ir, Os, Al, Mo, or an alloy containing two or more metals, such as Al:Nd alloy, MoW alloy. However, the present invention is not limited thereto.

Furthermore, a thin-film transistor (TFT) 211, including the semiconductor active layer 202, the gate electrode 207, the source electrode 209, and the drain electrode 210, is formed.

A protective layer 212 is formed on the source electrode 209 and the drain electrode 210. The protective layer 212 includes a structure in which at least one layer of a passivation layer and/or a planarization film is stacked. The protective layer 212 may be at least one of an inorganic insulation layer and an organic insulation layer. The protective layer 212 may be formed of a composite stacked structure in which inorganic insulation layers and organic insulation layers are alternately stacked.

The inorganic insulation layer may contain $SiO_2$, $SiN_X$, SiON, $Al_2O_3$, $TiO_2$, $Ta_2O_5$, $HfO_2$, $ZrO_2$, BST, PZT, etc., whereas the organic insulation layer may contain general universal polymer (PMMA, PS, etc.), a polymer inducer having a phenol group, an acrylic polymer, an imide-based polymer, an aryl ether-based polymer, an amide-based polymer, a fluorine-based polymer, a p-xylene-based polymer, a vinyl alcohol-based polymer, or a blend thereof.

Therefore, the protective layer 212 covering the source electrode 209 and the drain electrode 210 protects the TFT 211.

The protective layer 212 is formed so as to expose a portion of the drain electrode 210, where an organic emissive device 213 is formed and is connected to the exposed drain electrode 210. The organic emissive device 213 is a device for displaying predetermined ii display data by emitting red, green, and blue lights according to current. The organic emissive device 213 includes a first electrode 214, a second electrode 215, and an intermediate layer 216 interposed between the first electrode 214 and the second electrode 215.

The first electrode 214 is electrically connected to the drain electrode 210. The first electrode 214 may be formed of any of various conductive materials. For example, the first electrode 214 may be formed as a transparent layer or a reflective layer.

When the first electrode 214 is formed as a transparent layer, the first electrode 214 may contain ITO, IZO, ZnO or $In_2O_3$. When the first electrode 214 is formed as a reflective layer, the first electrode 214 may be formed by forming a reflective film by using Ag, Mg, Al, Pt, Pd, Au, Ni, Nd, Ir, Cr, or a compound thereof, and forming ITO, IZO, Zno or $In_2O_3$ thereon.

A pixel-defining layer (PDL) 217, which is an insulation layer, is formed on the first electrode 214. The PDL 217 may be formed of a material containing an acrylic or imide-based polymer.

A predetermined opening is formed in the PDL 217 so as to expose a portion of the first electrode 214. The intermediate layer 216 is formed on the exposed portion of the first electrode 214. The intermediate layer 216 includes an organic emissive layer (EML) and, when a voltage is applied via the first electrode 214 and the second electrode 215, the intermediate layer 216 embodies visible rays.

The intermediate layer 216 may be formed of an organic monomer material or an organic polymer material.

In the case of using a monomer organic material, the intermediate layer 216 may be formed by stacking a hole injection layer (HIL), a hole transport layer (HTL), an EML, an electron transport layer (ETL), and an electron injection layer (EIL) in a single structure or a composite structure.

In the case of using a monomer organic material, the intermediate layer 216 may ii be formed of various materials including copper phthalocyanine (CuPc), N,N'-Di(naphthalene-1-yl)-N,N'-diphenyl-benzidine (NPB), tris-8-hydroxyquinoline aluminum (Alq3), etc. The monomer organic material may be formed via a method, such as vacuum deposition using masks.

In this regard, the HIL, the HTL, the ETL, and the EIL are common layers and may be commonly applied to red pixels, green pixels, and blue pixels. In this case, the common layers may be formed to cover all pixels, like the second electrode 215.

In the case of using an organic polymer material, a structure including a HTL and an EML may be employed. Here, the HTL may be formed of PEDOT, and the EML may be formed of a Poly-Phenylene vinylene (PPV)-based or fluorine-based organic polymer material, via screen printing or inkjet printing.

The second electrode 215 is formed on the intermediate layer 216. The second electrode 215 is formed to cover all pixels. The second electrode 215 may be formed as a transparent layer or a reflective layer.

If the second electrode 215 is formed as a transparent layer, a layer formed of Li, Ca, LiF/Ca, LiF/Al, Al, Mg, Ag, or a compound thereof may be formed, and an auxiliary electrode or a bus electrode line formed of a transparent layer-forming material, such as ITO, IZO, ZnO or $In_2O_3$, may be formed thereon. If the second electrode 215 is formed as a reflective layer, the second electrode 215 may be formed by depositing Li, Ca, LiF/Ca, LiF/Al, Al, Mg, Ag, or a compound thereof on the entire top surface of the substrate 110.

The first electrode 214 and the second electrode 215 are formed so as to have polarities of an anode and a cathode, respectively. In this regard, the polarities of the first electrode 214 and the second electrode 215 may be reversed.

The first electrode 214 and the second electrode 215 are insulated from each other by the intermediate layer 216, and the intermediate layer 216 emits light as voltages of opposite polarities are applied to the first electrode 214 and the second electrode 215.

In this regard, a plurality of protrusions and recessions 221 are formed in the non-display region 150. The protrusions and recessions 221 are formed in a region outside the display region 120 by patterning a plurality of protrusions and a plurality of recessions by using an insulation material.

The protrusions and recessions 221 are formed so as to easily connect one of the electrodes of the organic emissive device 213 to a power wire, or for outgassing the OLED display 100 during a manufacturing process.

Referring to FIG. 3, the plurality of protrusions and recessions 221 are patterned on the substrate 110. The protrusions and recessions 221 are formed in the non-display region 150 formed around the display region 120 (see FIG. 1) in a particular pattern. The protrusions and recessions 221 are formed of a material that is substantially the same as the material constituting the protective layer 212 (see FIG. 2).

Alternatively, the protrusions and recessions 221 may be formed of any insulation materials. The protrusions and recessions 221 may be either formed simultaneously with the protective layer 212 is formed or formed individually in a separate operation.

A first conductive pattern 222 (FIG. 3) is formed on the protrusions and recessions 221. The first conductive pattern 222 may function as wires. The first conductive pattern 222 may be formed of a material that is substantially the same as the material constituting the first electrode 214.

Alternatively, the first conductive pattern 222 may be formed of any conductive material. The first conductive pattern 222 may be either formed simultaneously with the first electrode 214 or formed individually in a separate operation.

A second conductive pattern 223 is formed on the first conductive pattern 222. The second conductive pattern 223 substantially corresponds to the second electrode 215 formed throughout the top surface of the substrate 110. The second conductive pattern 223 may be electrically connected to the first conductive pattern 222 in the non-display region 150 and apply external power.

When the second conductive pattern 223 is electrically connected to the first conductive pattern 222, since the plurality of protrusions and recessions 221 are formed, short-circuits may be minimized. Furthermore, the protrusions and recessions 221 have a structure in which a plurality of openings are formed, and thus a contact area between the first conductive pattern 222 and the second conductive pattern 223 may increase.

During a nozzle printing operation, a nozzle unit 301 moves in a direction across the substrate 110 and ejects an organic raw material 302 into desired regions on the substrate 110. The nozzle unit 301 moves from an edge of the substrate 110 to the opposite edge of the substrate 110 for continuous ejections.

In this regard, the nozzle unit 301 may be a single nozzle unit for applying an organic raw material of a desired color, such as red, green, or blue, to each sub-pixel or a multi-nozzle for simultaneously applying organic raw materials of a plurality of colors to sub-pixels.

When the nozzle unit 301 moves in a direction across the substrate 110 and applies the organic raw material 302, the organic raw material 302 also remains in the protrusions and recessions 221 formed in the non-display region 150. An organic material removal operation, such as plasma processing, is performed to remove the remaining organic raw material 302. However, since a significant amount of organic material remains in openings of the protrusions and recessions 221, it is necessary to remove the organic material that remains in openings of the protrusions and recessions 221 as much as possible.

In this regard, the protrusions and recessions 221 are formed in the non-display region 150 in a particular pattern.

Figure 4:
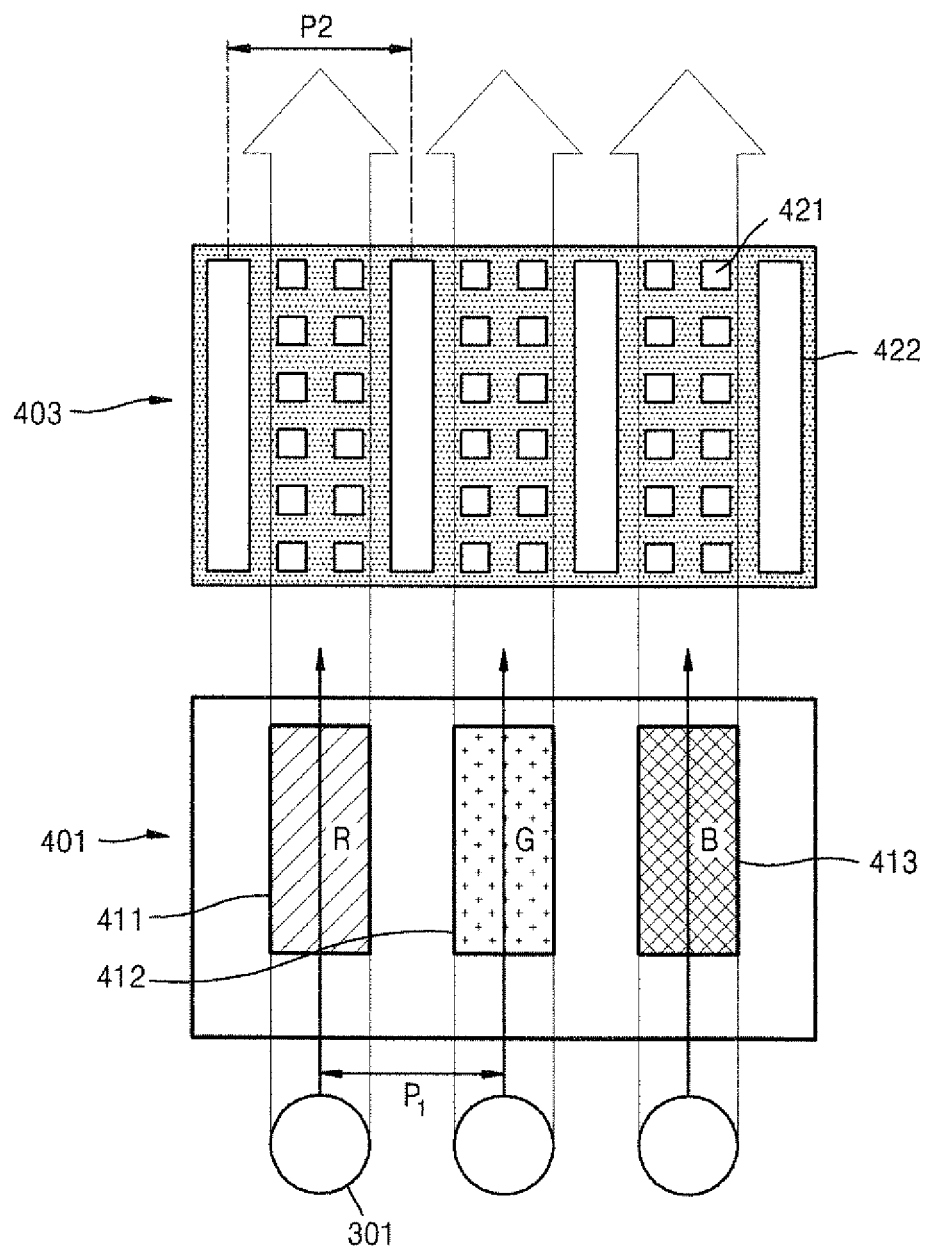
FIGS. 4 through 11 show patterns of protrusions and recessions formed on a substrate according to embodiments of the present invention.

FIG. 4 shows a pattern of a protrusions and recessions formed on a substrate according to an embodiment of the present invention.

Referring to FIG. 4, a red sub-pixel 411, a green sub-pixel 412, and a blue sub-pixel 413 are arranged in a display region 401. Although the red, green, and blue sub-pixels 411, 412, and 413, respectively, are arranged on the same line in the present embodiment, the red, green, and blue sub-pixels 411, 412 and 413, respectively, may be arranged in any of various patterns, such as a zigzag pattern, a honeycomb-like pattern, etc.

Protrusions and recessions are formed in a non-display region defined at the upper edge of the display region 401. The non-display region corresponds to a cathode contacting region 403. In other words, the non-display region corresponds to a region in which the second conductive pattern 223 is connected to the first conductive pattern 222, and is a region in which one of the electrodes on the display region 401 is connected to a power wire at the cathode contacting region 403.

The protrusions and recessions include first protrusions and recessions 421 with relatively small openings and second protrusions and recessions 422 with relatively large openings. As the first and second protrusions and recessions 421 and 422, respectively, are formed, at least one of the first and second conductive patterns 222 and 223, respectively, has a plurality of branched conductive lines. Therefore, even if a conductive line is short-circuited, electrical connection may be established via another line.

The nozzle units 301 move from an edge of the display region 401 to the opposite edge of the display region 401 in a direction indicated by arrows, eject a red organic raw material to the red sub-pixel 411, eject a green organic raw material to the green sub-pixel 412, and eject a blue organic raw material to the blue sub-pixel 413.

In this regard, in the cathode contacting region 403, the first and second protrusions and recessions 421 and 422, respectively, are formed so as to have openings of different sizes according to pitches between the nozzle units 301 in the direction in which the nozzle units 301 move.

As indicated by the arrows, when the nozzle units 301 move in a direction across a substrate, the red organic raw material and the green organic raw material may overlap with each other in the space between the red sub-pixel 411 and the green sub-pixel 412, and the green organic raw material and the blue organic raw material may overlap with each other in the space between the green sub-pixel 412 and the blue sub-pixel 413 in the direction in which the nozzle units 301 move.

The overlapping occurs as the red, green, and blue organic raw materials spread to adjacent spaces during application of the red, green, and blue organic raw materials. In other words, organic raw materials remaining in unnecessary spaces in the display region 401 may be easily removed via a plasma processing operation. However, organic raw materials remaining in openings of the first and second protrusions and recessions 421 and 422, respectively, is not easy to remove.

Therefore, in a direction in which the nozzle units 301 move, it is necessary to minimize organic raw materials remaining in the cathode contacting region 403 corresponding to the spaces between the red, green, and blue sub-pixels 411, 412 and 413, respectively.

In this regard, in the direction in which the nozzle units 301 move, the first protrusions and recessions 421 with relatively small openings are formed at locations of the cathode contacting region 403 corresponding to the red, green, and blue sub-pixels 411, 412 and 413, respectively.

On the other hand, in the direction in which the nozzle units 301 move, the second protrusions and recessions 422 with relatively large openings are formed at locations of the cathode contacting region 403 corresponding to the space between the red sub-pixel 411 and the green sub-pixel 412, or corresponding to the space between the green sub-pixel 412 and the blue sub-pixel 413.

In the present embodiment, the first protrusions and recessions 421 include a plurality of patterned rectangular small openings, whereas the second protrusions and recessions 422 include a single patterned rectangular large opening.

In this regard, the size of a single opening formed as the second protrusions and recessions 422 is relatively larger than that of an opening formed as the first protrusions and recessions 421. Furthermore, the number of second protrusions and recessions 422 is relatively less than the number of first protrusions and recessions 421.

As described above, since the second protrusions and recessions 422 formed in a region corresponding to the space between the red sub-pixel 411 and the green sub-pixel 412, or corresponding to the space between the green sub-pixel 412 and the blue sub-pixel 413, include a single large opening, when red, green, and blue organic raw materials are ejected by the nozzle units 301, accumulation of organic raw materials in the second protrusions and recessions 422 may be minimized.

As the number of second protrusions and recessions 422 is reduced to one, the number of boundaries between a plurality of openings may be reduced, and thus the possibility for organic raw materials to remain in the space between the red sub-pixel 411 and the green sub-pixel 412 in which the red organic raw material and the green organic raw material overlap with each other, or in the space between the green sub-pixel 412 and the blue sub-pixel 413 in which the green organic raw material and the blue organic raw material overlap with each other, may be reduced.

On the other hand, in the direction in which the nozzle units 301 move, the first protrusions and recessions 421 with relatively small openings are formed at locations of the cathode contacting region 403 corresponding to the red, green, and blue sub-pixels 411, 412 and 413, respectively, and thus electrical connection between one of the electrodes in the display region 401 and a power wire may be easily established.

Particular design rules are necessary for forming the first protrusions and recessions 421 and the second protrusions and recessions 422 in the cathode contacting region 403.

It is necessary for a pitch P1 between the red sub-pixel 411 and the green sub-pixel 412, or between the green sub-pixel 412 and the blue sub-pixel 413, to be identical to a pitch P2 between the adjacent second protrusions and recessions 422.

In this regard, the pitch P1 between the sub-pixels is the length of an imaginary line interconnecting the centers of a pair of the sub-pixels 411 through 413 adjacent to each other, whereas the pitch P2 between the second protrusions and recessions 422 is also the length of an imaginary line interconnecting the centers of a pair of the second protrusions and recessions 422 adjacent to each other.

In other words, in the direction in which the nozzle units 301 move, an interval between the nozzle units 301 adjacent to each other is determined based on a pitch between sub-pixels adjacent to each other, and, as the interval between the nozzle units 301 is determined, an interval between the protrusions and recessions 422 is determined at locations of the cathode contacting regions 403, the locations corresponding to spaces between the sub-pixels.

Therefore, organic raw materials may be applied to regions of the cathode contacting region 403 respectively designated to the organic raw materials, and thus concentration of organic raw materials in a particular region may be prevented.

As described above, in a non-display region like the cathode contacting region 403, the remaining organic raw material may be reduced by forming the first and second protrusions and recessions 421 and 422, respectively, so as to have different numbers and different unit opening areas according to a direction in which the nozzle units 301 move and the pitch between the nozzle units 301. As a result, contact resistance due to organic raw material remaining in the cathode contacting region 403 may be lowered.

Although the first and second protrusions and recessions 421 and 422, respectively, have rectangular openings having different sizes in the present embodiment, the present invention is not limited thereto, and the openings of the first and second protrusions and recessions 421 and 422, respectively, maybe patterned to have shapes of arbitrary polygons, such as a circle, a triangle, etc., a partially repeating shape, a zigzag shape, etc.

Figure 5:
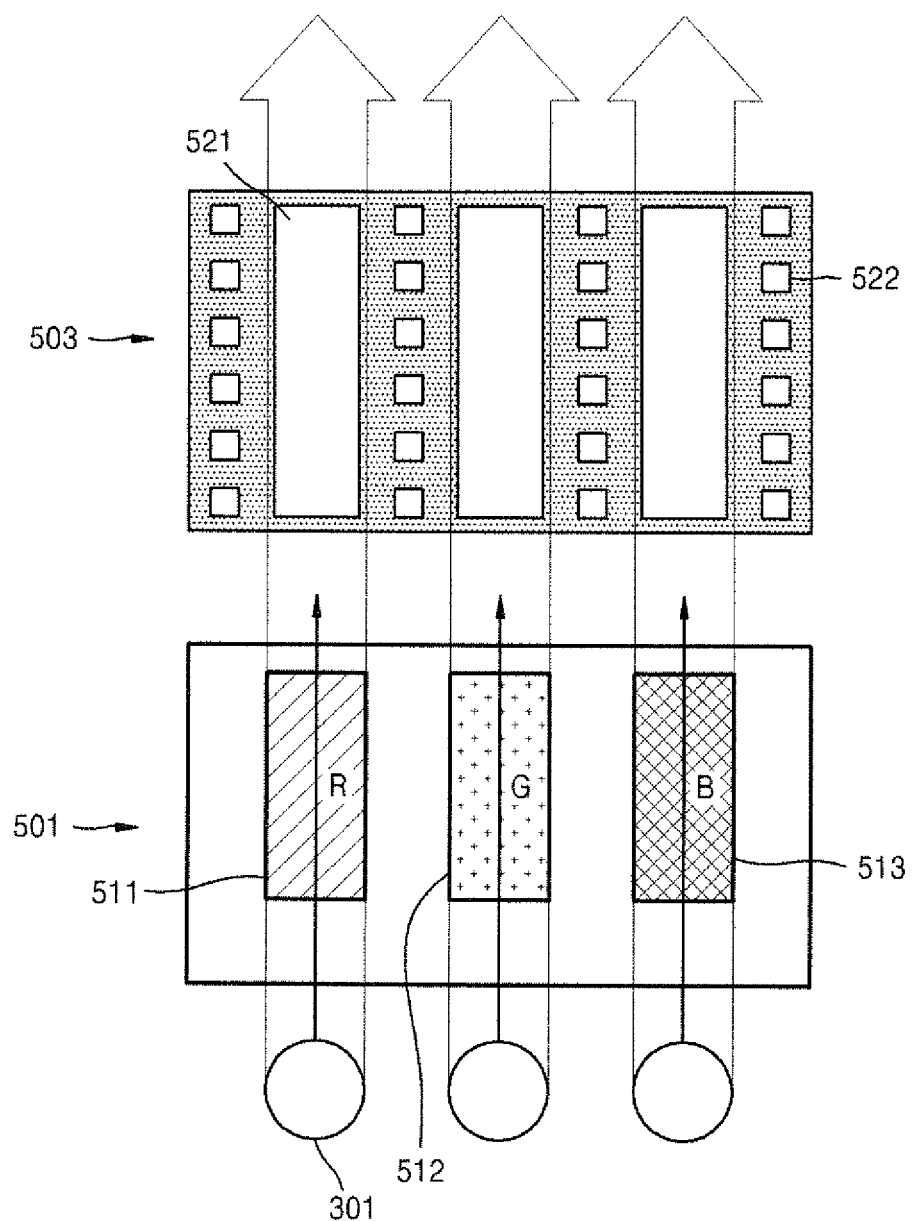

FIG. 5 shows a protrusion and recession pattern according to another embodiment of the present invention.

Referring to FIG. 5, a red sub-pixel 511, a green sub-pixel 512, and a blue sub-pixel 513 are arranged in a display region 501. First protrusions and recessions 521 and second protrusions and recessions 522, which have different sizes and unit opening areas, are formed in a cathode contacting region 503, which is anon-display region defined at the upper ii edge of the display region 501.

Unlike in the above embodiment shown in FIG. 4, in the direction in which the nozzle units 301 move, the first protrusions and recessions 521 with relatively large openings are formed at locations of the cathode contacting region 503 corresponding to the red, green, and blue sub-pixels 511, 512 and 513, respectively, whereas the second protrusions and recessions 521 with relatively small openings are formed at locations of the cathode contacting region 503 corresponding to the space between the red sub-pixel 511 and the green sub-pixel 512 or the space between the green sub-pixel 512 and the blue sub-pixel 513.

In this regard, the first protrusions and recessions 521 include a plurality of patterned rectangular large openings, whereas the second protrusions and recessions 522 include single patterned rectangular small openings.

In the present embodiment, a surface treatment is selectively performed by using a separate nozzle unit before organic raw materials are applied, and thus the organic raw materials do not remain in the space between the red sub-pixel 511 and the green sub-pixel 512 or in the space between the green sub-pixel 512 and the blue sub-pixel 513, where red, green, and blue organic raw materials overlap with each other.

In the first and second protrusions and recessions 521 and 522, respectively, having the structure described above, it is still necessary for a pitch between the red sub-pixel 511 and the green sub-pixel 512 or between the green sub-pixel 512 and the blue sub-pixel 513 to be identical to a pitch between the adjacent second protrusions and recessions 522.

Accordingly, contact resistance due to organic raw material remaining in the cathode contacting region 503 may be lowered.

Figure 6:
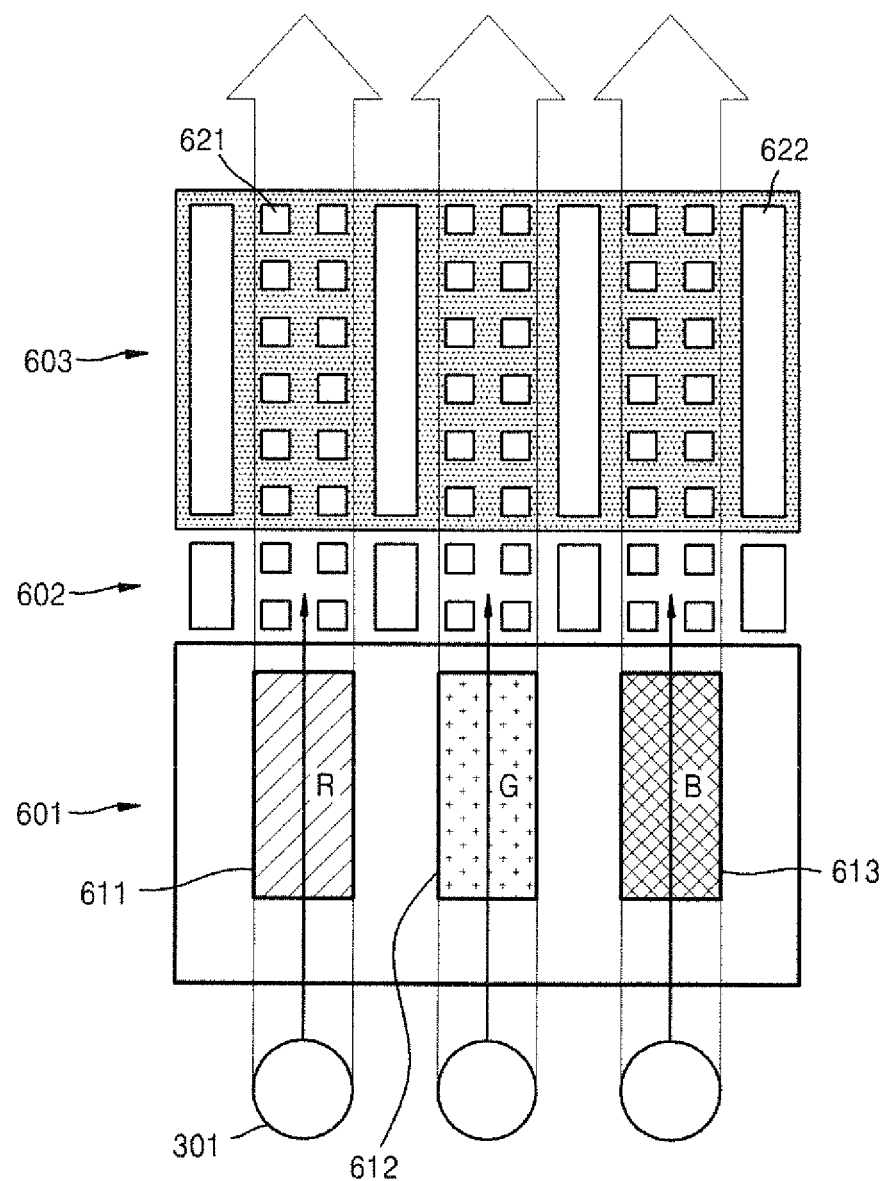

FIG. 6 shows a protrusion and recession pattern according to another embodiment of the present invention.

Referring to FIG. 6, a red sub-pixel 611, a green sub-pixel 612, and a blue sub-pixel 613 are arranged in a display region 601.

A non-display region defined at the upper edge of the display region 601 includes an outgassing portion 602 and a cathode contacting region 603 which is adjacent to the outgassing portion 602. The outgassing portion 602 is a hole for outgassing an organic raw material patterned below a substrate, while the cathode contacting region 603 is where one of the electrodes of the display region 601 is connected to a power wire.

In the direction in which the nozzle units 301 move, the first protrusions and recessions 621 with relatively small openings are formed at locations of the outgassing portion 602 and the cathode contacting region 603 corresponding to the red sub-pixel 611, the green sub-pixel 612, and the blue sub-pixel 613, whereas the second protrusions and recessions 622 with relatively large openings are formed at locations of outgassing portion 602 and the cathode contacting region 603 corresponding to the space between the red sub-pixel 611 and the green sub-pixel 612 or the space between the green sub-pixel 612 and the blue sub-pixel 613.

According to the present embodiment, the first protrusions and recessions 621 include a plurality of patterned rectangular small openings, whereas the second protrusions and recessions 622 include single patterned rectangular large openings.

In this regard, the size of the single opening formed as the second protrusions and recessions 622 is relatively larger than the size of one of the openings formed as the first protrusions and recessions 621. Furthermore, the number of second protrusions and recessions 622 is relatively less than the number of first protrusions and recessions 621.

In the first and second protrusions and recessions 621 and 622, respectively, having the structure as described above, it is necessary for a pitch between the red sub-pixel 611 and the green sub-pixel 612 or between the green sub-pixel 612 and the blue sub-pixel 613 to be identical to a pitch between the adjacent second protrusions and recessions 622.

As described above, in a non-display region like the cathode contacting region 603 the first and second protrusions and recessions 421 and 422, respectively, the remaining organic raw material may be easily removed by forming the protrusions and recessions 621 and 622, respectively, to have different numbers and different unit opening areas according to a direction in which the nozzle units 301 move and a pitch between the nozzle units 301.

Furthermore, since the protrusions and recessions 621 and 622, respectively, are formed so as to have different numbers and different unit opening areas in the outgassing portion 602 and the cathode contacting region 603, the remaining organic raw material may be reduced, and thus panel reliability may be improved.

Furthermore, contact resistance at the cathode contacting region 603 may be lowered.

Figure 7:
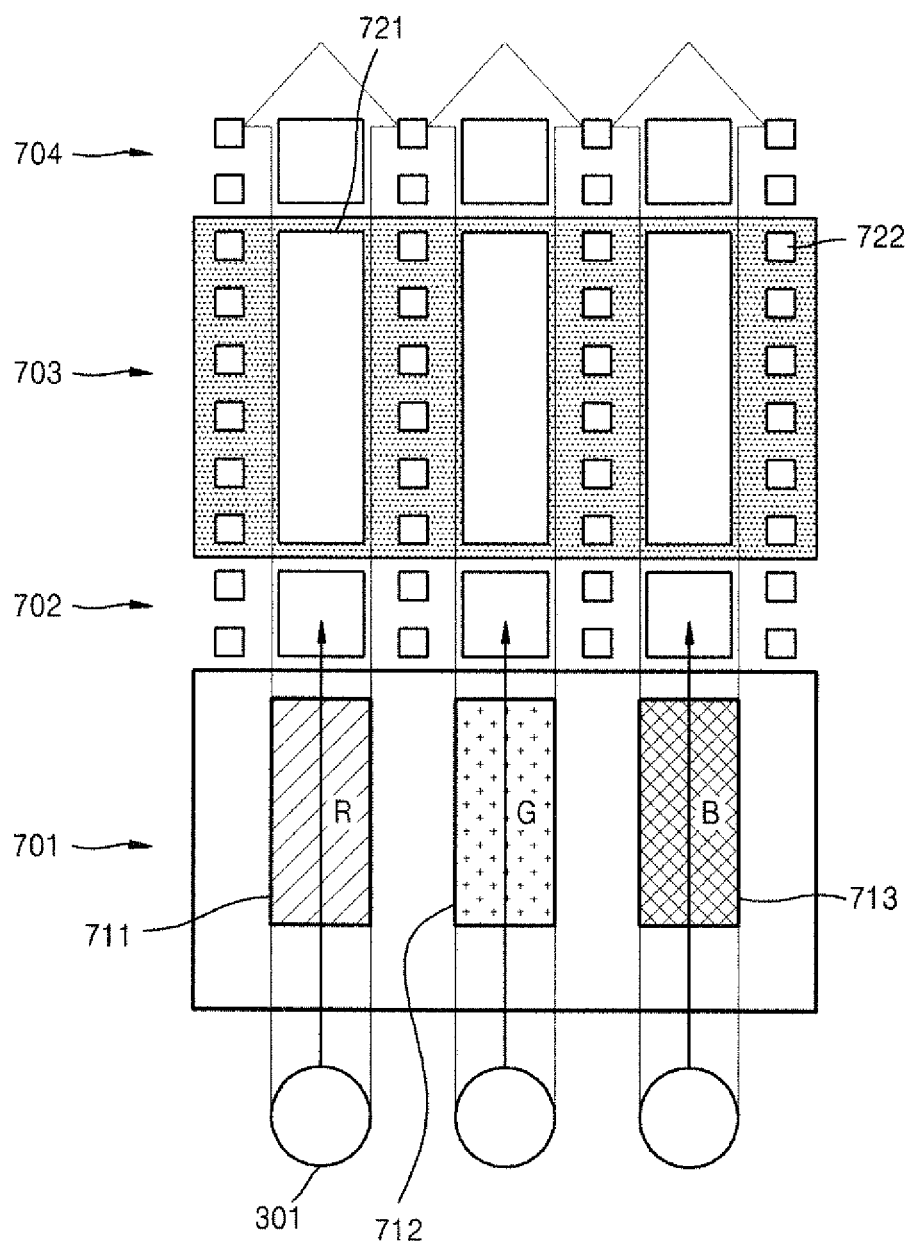

FIG. 7 shows a protrusion and recession pattern according to another embodiment of the present invention.

Referring to FIG. 7, a red sub-pixel 711, a green sub-pixel 712, and a blue sub-pixel 713 are arranged in a display region 701.

A non-display region defined at the upper edge of the display region 701 includes an outgassing portion 702, a cathode contacting region 703 adjacent to the outgassing portion 702, and a non-cathode contacting region 704 adjacent to the cathode contacting region 703. The non-cathode contacting region 704 is a region in which a second conductive layer pattern, such as a cathode, is not deposited.

The outgassing portion 702, the cathode contacting region 703, and the non-cathode contacting region 704, which are non-display regions defined at the upper edge of the display region 701, include first protrusions and recessions 721 and second protrusions and recessions 722 having different numbers and unit opening areas.

In the direction in which the nozzle units 301 move, the first protrusions and recessions 721 with relatively large openings are formed at locations of the outgassing portion 702, the cathode contacting region 703, and the non-cathode contacting region 704 corresponding to the red sub-pixel 711, the green sub-pixel 712, and the blue sub-pixel 713, whereas the second protrusions and recessions 722 with relatively small openings are formed at locations of outgassing portion 702, the cathode contacting region 703, and the non-cathode contacting region 704 corresponding to the space between the red sub-pixel 711 ii and the green sub-pixel 712 or the space between the green sub-pixel 712 and the blue sub-pixel 713.

According to the present embodiment, the first protrusions and recessions 721 include a single patterned rectangular large opening, whereas the second protrusions and recessions 722 include a plurality of patterned rectangular small openings.

Figure 8:
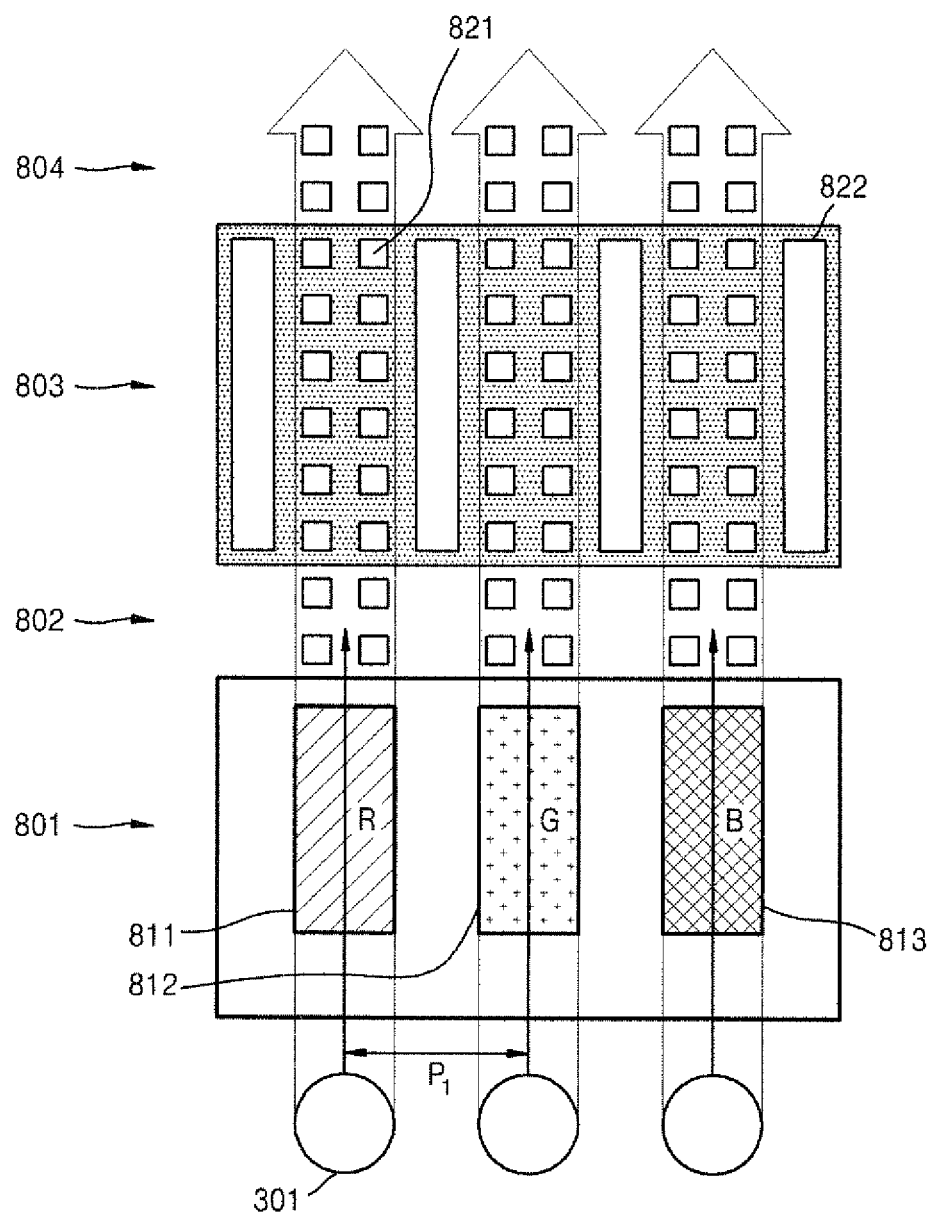

As described above, since the protrusions and recessions 721 and 722, respectively, are formed so as to have different numbers and different unit opening areas in the outgassing portion 702, the cathode contacting region 703, and the non-cathode contacting region 704, the remaining organic raw material may be reduced FIG. 8 shows a protrusion and recession pattern according to another embodiment of the present invention.

Referring to FIG. 8, a red sub-pixel 811, a green sub-pixel 812, and a blue sub-pixel 813 are arranged in a display region 801.

A non-display region defined at the upper edge of the display region 801 includes an outgassing portion 802, a cathode contacting region 803 adjacent to the outgassing portion 802, and anon-cathode contacting region 804 adjacent to the cathode contacting region 803. The non-cathode contacting region 804 is a region in which a second conductive layer pattern, such as a cathode, is not deposited.

In the direction in which the nozzle units 301 move, the first protrusions and recessions 821 with relatively small openings are formed at locations of the outgassing portion 802, the cathode contacting region 803, and the non-cathode contacting region 804 corresponding to the red sub-pixel 811, the green sub-pixel 812, and the blue sub-pixel 813, whereas the second protrusions and recessions 822 with relatively large openings are formed at locations of outgassing portion 802, the cathode contacting region 803, and the non-cathode contacting region 804 corresponding to the space between the red sub-pixel 811 and the green sub-pixel 812 or the space between the green sub-pixel 812 and the blue sub-pixel 813.

In this regard, in the outgassing portion 802, protrusions and recessions are partially removed in comparison to the embodiment of FIG. 7. Furthermore, in the non-cathode contacting region 804, protrusions and recessions are partially removed in comparison to the embodiment of FIG. 7.

The regions in which protrusions and recessions are partially removed are portions of the outgassing portion 802 and the non-cathode contacting region 804 corresponding to the space between the red sub-pixel 811 and the green sub-pixel 812 or the space between the green sub-pixel 812 and the blue sub-pixel 813.

Figure 9:
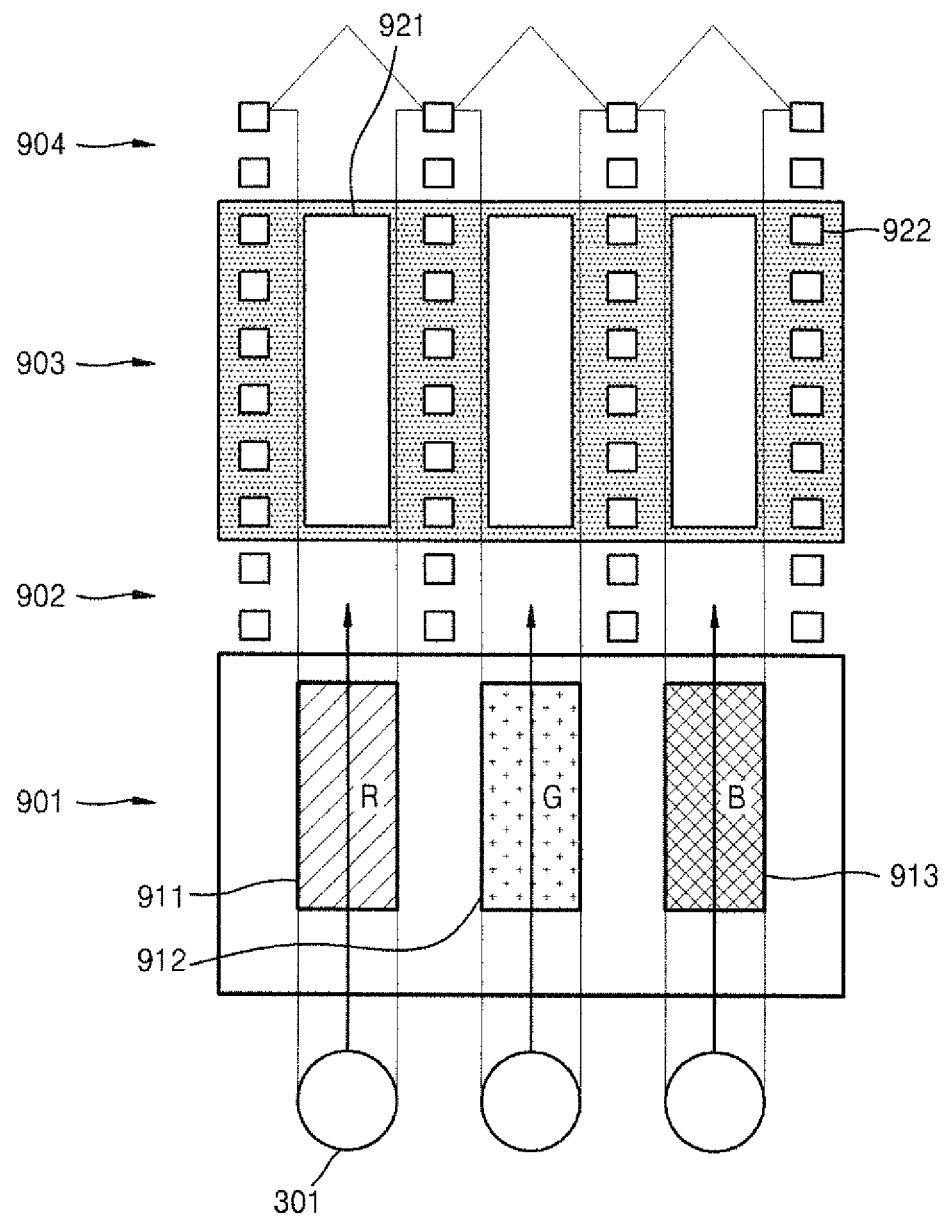

FIG. 9 shows a protrusion and recession pattern according to another embodiment of the present invention.

Referring to FIG. 9, a red sub-pixel 911, a green sub-pixel 912, and a blue sub-pixel 913 are arranged in a display region 901.

In the direction in which the nozzle units 301 move, first protrusions and recessions 921 with relatively large openings are formed at locations of the outgassing portion 902, the cathode contacting region 903, and the non-cathode contacting region 904 corresponding to the red sub-pixel 911, the green sub-pixel 912, and the blue sub-pixel 913, whereas second protrusions and recessions 922 with relatively small openings are formed at locations of the outgassing portion 902, the cathode contacting region 903, and the non-cathode contacting region 904 corresponding to the space between the red sub-pixel 911 and the green sub-pixel 912 or the space between the green sub-pixel 912 and the blue sub-pixel 913.

In this regard, the regions in which protrusions and recessions are partially removed are the outgassing portion 902 and the non-cathode contacting region 904 corresponding to the space between the red sub-pixel 911 and the green sub-pixel 912 or the space between the green sub-pixel 912 and the blue sub-pixel 913.

The regions in which protrusions and recessions are partially removed are portions of the outgassing portion 902 and the non-cathode contacting region 904 corresponding to the red sub-pixel 911, the green sub-pixel 912, and the blue sub-pixel 913.

Figure 10:
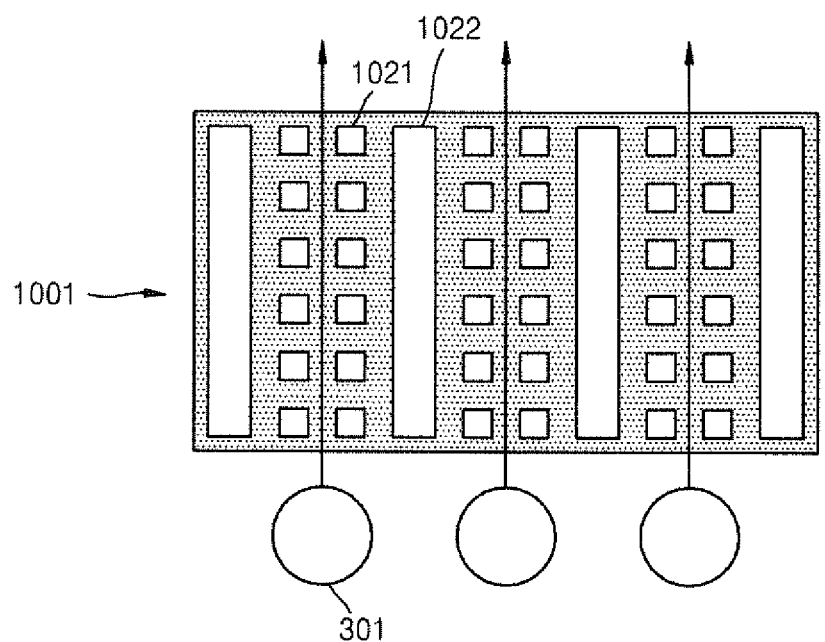

FIG. 10 shows a protrusion and recession pattern according to another embodiment of the present invention.

Referring to FIG. 10, first protrusions and recessions 1021 and second protrusions and recessions 1022 having different numbers and unit opening areas are formed in a cathode contacting region 1001.

In the present embodiment, the cathode contacting region 1001 is a region formed at the entrance to a display region in a direction in which the nozzle units 301 move. The first protrusions and recessions 1021 is a region corresponding to regions to which colored organic raw materials are applied, where a plurality of small openings are patterned in the first protrusions and recessions 1021. The second protrusions and recessions 1022 is a region corresponding to spaces between the region to which colored organic raw materials are applied, where a single large opening is patterned in the second protrusions and recessions 1022.

Figure 11:
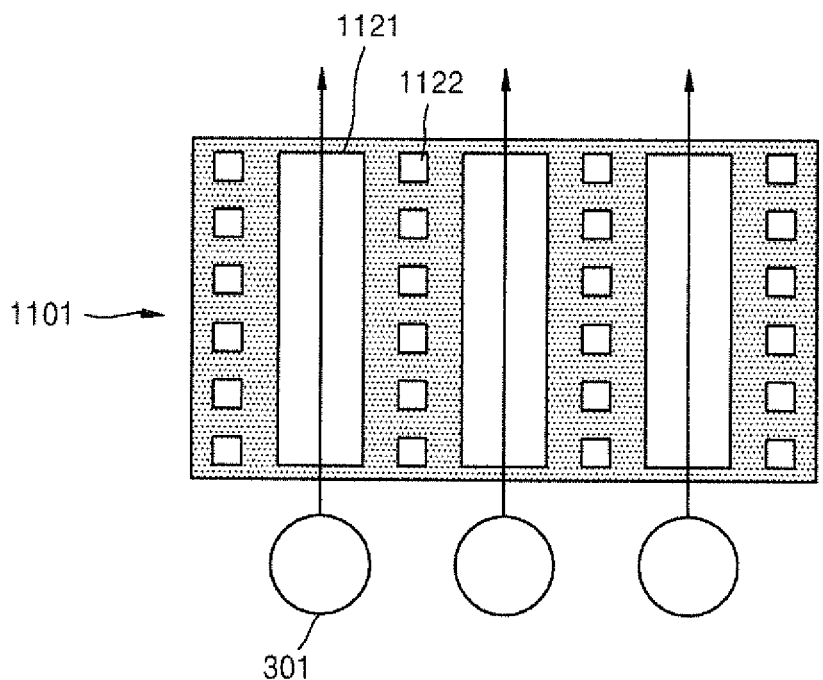

FIG. 11 shows a protrusion and recession pattern according to another embodiment of the present invention.

Referring to FIG. 11, first protrusions and recessions 1121 and second protrusions and recessions 1122 having different numbers and unit opening areas are formed in a cathode contacting region 1101. The cathode contacting region 1101 is a region formed at the entrance to a display region in a direction in which the nozzle units 301 move.

Unlike in the embodiment shown in FIG. 10, the first protrusions and recessions 1121 corresponding to regions to which colored organic raw materials are applied include single patterned large openings, whereas the second protrusions and recessions 1122 corresponding to spaces between the region to which colored organic raw materials are applied include a plurality of patterned small openings.

According to embodiments of the present invention as described above, an OLED display according to the present invention may have the following effects.

First, since protrusions and recessions having different numbers and unit opening areas are formed in a non-display region, organic raw materials applied during the manufacturing process may be prevented from remaining. Therefore, an increase in contact resistance due to organic raw materials remaining in a cathode contact region may be reduced.

Second, since the amount of organic raw materials remaining in a non-display region may be reduced, deterioration of the reliability of a display device due to outgassing may be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting diode (OLED) display, comprising:
    a substrate; and
    a plurality of sub-pixels formed on the substrate;
    wherein the substrate comprises:
        a display region having formed therein sub-pixels to which colored organic materials are applied; and
        a non-display region formed at edges of the display region;
    wherein the non-display region comprises an outgassing portion and a cathode contacting portion; and
    wherein protrusions and recessions having different numbers and unit opening areas are formed in at least one of the outgassing portion and the cathode contacting region.

2. The OLED display of claim 1, wherein the protrusions and recessions comprise:
    a plurality of first protrusions and recessions having a first unit opening area; and
    a plurality of second protrusions and recessions having a second unit opening area which is larger than the first unit opening area.

3. The OLED display of claim 2, wherein a number of second protrusions and recessions is less than a number of the first protrusions and recessions.

4. The OLED display of claim 3, wherein a size of each opening formed as the second protrusions and recessions is larger than a size of each opening formed as the first protrusions and recessions.

5. The OLED display of claim 2, wherein one of the outgassing portion and the cathode contacting region is continuously defined from an edge of the display region to an opposite edge of the display region in a direction in which nozzle units depositing organic raw materials move;
   wherein the first protrusions and recessions are formed in portions of the non-display region corresponding to the sub-pixels; and
   wherein the second protrusions and recessions are formed in portions of the non-display region corresponding to spaces between the sub-pixels.

6. The OLED display of claim 5, wherein a pitch between a pair of sub-pixels adjacent to each other is identical to a pitch between a pair of the second protrusions and recessions formed in a portion of the non-display region corresponding to a space between the sub-pixels.

7. The OLED display of claim 1, wherein the protrusions and recessions have one of a polygonal opening pattern and a circular opening pattern.

8. The OLED display of claim 1, wherein one of the outgassing portion and the cathode contacting region is continuously defined outside the display region from an edge of the display region to an opposite edge of the display region in a direction in which nozzle units depositing organic raw materials move; and
   wherein the protrusions and recessions are formed so as to have different unit opening areas in adjacent regions formed in the direction in which the nozzle units move.

9. The OLED display of claim 8, wherein a pitch between a pair of sub-pixels adjacent to each other in the direction in which the nozzle units move is identical to a pitch between a pair of protrusions and recessions formed adjacent to each other in a portion of the non-display region corresponding to a space between the sub-pixels.

10. The OLED display of claim 8, wherein the protrusions and recessions comprise:
   first protrusions and recessions formed in portions of the non-display region corresponding to sub-pixels adjacent to each other in the direction in which the nozzle units move; and
   second protrusions and recessions formed in portions of the non-display region corresponding to spaces between the sub-pixels and having a unit opening area different from a unit opening area of the first protrusions and recessions.

11. The OLED display of claim 10, wherein, when a unit opening area of the first protrusions and recessions is smaller than a unit opening area of the second protrusions and recessions, a number of first protrusions and recessions is greater than a number of second protrusions and recessions.

12. The OLED display of claim 10, wherein, when a unit opening area of the first protrusions and recessions is larger than a unit opening area of the second protrusions and recessions, a number of first protrusions and recessions is less than a number of second protrusions and recessions.

13. The OLED display of claim 1, wherein the cathode contacting region is a region in which an electrode of the display region and a power wire are electrically connected to each other.

14. The OLED display of claim 1, wherein a non-cathode contacting region, in which no conductive pattern is formed, is further defined in a region adjacent to the cathode contacting region; and
   wherein protrusions and recessions having different unit opening areas are formed in the non-cathode contacting region.

15. The OLED display of claim 1, wherein the display region comprises:
   a thin-film transistor (TFT) including a semiconductor active layer, a gate electrode, a source electrode and a drain electrode;
   an insulation layer formed to cover the source electrode and the drain electrode; and
   an organic emissive device formed on the insulation layer and including:
      a first electrode connected to one of the source electrode and the drain electrode;
      an emissive layer; and
      a second electrode.

16. The OLED display of claim 15, wherein a plurality of protrusions and recessions are formed in portions of the non-display region adjacent to the display region;
   wherein a first conductive pattern corresponding to a power wire arranged on the substrate is formed on the protrusions and recessions; and
   wherein a second conductive pattern corresponding to the one of first electrode and the second electrode is formed on the first conductive pattern.

17. The OLED display of claim 16, wherein the protrusions and recessions comprise:
   a plurality of first protrusions and recessions having a first unit opening area; and
   at least one second protrusions and recessions having a second unit opening area which is larger than the first unit opening area.

18. The OLED display of claim 17, wherein the first protrusions and recessions and the second protrusions and recessions are formed from an edge of the display region to an opposite edge of the display region in a direction in which a nozzle unit depositing organic raw materials moves;
   wherein the first protrusions and recessions are formed in portions of the non-display region respectively corresponding to sub-pixels; and
   wherein the second protrusions and recessions are formed in portions of the non-display region respectively corresponding to spaces between the sub-pixels.

19. The OLED display of claim 18, wherein a pitch between a pair of sub-pixels adjacent to each other is identical to a pitch between a pair of second protrusions and recessions formed in the portions of the non-display region respectively corresponding to spaces between the sub-pixels.

20. The OLED display of claim 16, wherein the protrusions and recessions comprise:
   at least one first protrusions and recessions having a first unit opening area; and
   a plurality of second protrusions and recessions having a second unit opening area, which is smaller than the first unit opening area.

* * * * *